(12) United States Patent
Brown et al.

(10) Patent No.: US 6,331,467 B1
(45) Date of Patent: Dec. 18, 2001

(54) METHOD OF MANUFACTURING A TRENCH GATE FIELD EFFECT SEMICONDUCTOR DEVICE

(75) Inventors: Adam R. Brown, Bramhall (GB); Raymond J. E. Hueting, Helmond; Godefridus A. M. Hurkx, Best, both of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/538,467

(22) Filed: Mar. 29, 2000

(30) Foreign Application Priority Data

Mar. 30, 1999 (GB) .................................................. 9907184

(51) Int. Cl.$^7$ ................................................. H01L 21/336
(52) U.S. Cl. ........................... 438/270; 438/138; 438/970
(58) Field of Search ................................... 438/138, 268, 438/269, 270, 589, 634, 970

(56) References Cited

U.S. PATENT DOCUMENTS

| | | | |
|---|---|---|---|
| 5,378,655 | 1/1995 | Hutchings et al. | 437/203 |
| 5,387,528 | 2/1995 | Hutchings et al. | 437/40 |
| 5,721,148 | * 2/1998 | Nishimura | 438/270 |
| 6,096,608 | * 8/2000 | Williams | 438/270 |

FOREIGN PATENT DOCUMENTS

| | | |
|---|---|---|
| 3932621 | * 4/1990 | (DE) . |
| 2187038A | 7/1990 | (JP) . |
| 9615550A1 | 5/1996 | (WO) . |

* cited by examiner

*Primary Examiner*—Chandra Chaudhari
(74) *Attorney, Agent, or Firm*—Steven R. Biren

(57) ABSTRACT

A semiconductor body (1) is provided having a first semiconductor region (3) of one conductivity type separated from a first major surface (5a) by a second semiconductor region (5) of the opposite conductivity type. A trench (7) is etched through the second semiconductor region (5) to an etch stop layer (4) provided in the region of the pn junction between the first (3) and second (5) regions, by using an etching process which enables the etching process to be stopped at the etch stop layer. A gate (8, 9) is provided within the trench (7). A source (12) separated from the first region (3) by the second region (5) is formed adjacent the trench so that a conduction channel area (50) of the second region (5) adjacent the trench provides a conduction path between the source and first regions which is controllable by the gate.

12 Claims, 3 Drawing Sheets

METHOD OF MANUFACTURING A TRENCH GATE FIELD EFFECT SEMICONDUCTOR DEVICE

BACKGROUND OF THE INVENTION

This invention relates to a method of manufacturing a semiconductor device comprising a trench gate field effect device. The device may be, for example, an insulated gate field effect power transistor or an insulated gate bipolar transistor. The invention also relates to a semiconductor device manufactured by such a method.

U.S. Pat. No. 5,378,655 (our reference: PHB33836) describes a method of manufacturing a semiconductor device comprising a trench gate field effect device wherein a semiconductor body having first and second major surfaces is provided having a first region of one conductivity type and a second region of the opposite conductivity type separating the first region from the first major surface. A trench is etched through the second semiconductor region and then a gate is provided within the trench with, in the example described in U.S. Pat. No. 5,378,655, the gate being an insulated gate having a gate dielectric region separating a conductive gate region from the trench walls. A source region of the one conductivity type separated from the first region by the second region is formed adjacent the trench so that a conduction channel area of the second region adjacent the trench provides a conduction path between the source and first regions which is controllable by the gate. Typically, the trench will define a regular array of parallel source cells each bounded by the trench.

As shown in the drawings of U.S. Pat. No. 5,378,655, the trench extends beyond the second region into the first region. Where such a device is operated in a reverse bias or blocking mode, large electrical fields can build up at the relatively sharp corners of the trench leading to breakdown at these points. It has previously been proposed, as shown in, for example, U.S. Pat. No. 5,387,528 (our reference: PHB33804), to provide each source cell with a central relatively highly doped deep region of the opposite conductivity type so as to move the avalanche breakdown point away from the trench corners into the centre of the source cell so as to enable the onset of avalanche breakdown to be delayed until higher voltages and to enable breakdown, if it does occur, to happen in a more controlled and reproducible manner. However, the introduction of such relatively highly doped central regions places a constraint on the minimum dimensions of the source cells which in turn places a constraint on the minimum on-resistance of the device because, for a given semiconductor surface area, the on-resistance is related to the channel width which itself is related to the size of the source cells.

SUMMARY OF THE INVENTION

It is an aim of the present invention to provide a method of manufacturing a semiconductor device comprising a trench gate field effect device which enables improved control over the properties of the device.

According to the present invention, there is provided a method of manufacturing a semiconductor device in which the etch stop layer is provided in the vicinity of the pn junction. Such a method is set out in claim 1.

A method embodying the present invention enables the depth of the trench to be well-controlled. This enables the location of the bottom of the trench to be selected so as to optimise particular device characteristics.

In an embodiment, the etch stop layer is provided at the pn junction between the first and second regions so that the trench has the same depth as the second or body region of the device enabling the electric fields at the corners of the trench to be reduced and so reducing the possibility of breakdown at the trench corners or at least raising the reverse biassing voltage at which breakdown may occur at those trench corners.

This enables the build up of large electrical fields at the corners of the trench to be alleviated without the need for a relatively highly doped central region of the opposite conductivity type which would otherwise place constraints on the minimum size of the source cells. This therefore enables the source cells to be smaller than would be the case if the central regions were required and thus enables a lower specific ON-resistance.

In an embodiment, the etch stop layer is provided within the first region so that, after the trench has been formed, the trench extends deeper into the semiconductor body than the second region to enable a minimum specific ON-resistance to be achieved.

Thus by controlling the position of the etch stop layer, the depth of the trench can be well-controlled and the device breakdown characteristics optimised by placing the etch stop layer at the pn junction between the first and second regions or the minimum ON-resistance of the device optimised by controllably locating the etch stop layer within the first region. In either case, the thicknesses of the first and second regions, especially the first region, can be optimised so reducing series resistance and the ON-resistance of the device.

In an embodiment, a first portion of the trench is etched using an etching process selected to enable good control over the lateral dimensions of the trench while the final portion of the trench is etched using an etching process that enables the etching to be stopped at the etch stop layer. Preferably, the etching process used for the first portion of the trench is an anisotropic etching process such as a plasma etching process. In a preferred embodiment, the etching process used to etch the final portion of the trench is an isotropic etching process which etches the first and second regions selectively relative to the further region, that is the selective isotropic etchant etches the first and second regions considerably more quickly than the etch stop layer. The use of an isotropic etchant to etch the final part of the trench also has the advantage that the bottom corners of the trench will be rounded by the isotropic etching process so enabling the device to have a higher breakdown voltage and a more uniform oxide thickness than would be the case if an anisotropic etching process had been used to etch the entirety of the trench. In a preferred embodiment, 90% of the depth of the trench is etched using an anisotropic etching process and the final 10% of the depth of the trench is etched using a selective isotropic etching process thereby enabling good control over the lateral extent of the trench whilst still allowing for rounding of the corners of the trench to alleviate the high fields at the corners. Greater rounding of the corners of the trench could be achieved by increasing the proportion of the depth etched by the isotropic etching process but this would give less control over the lateral extent of the trench.

In an embodiment the first and second regions are provided as regions of monocrystalline silicon and the etch stop layer is provided as a silicon-germanium (SiGe) layer. The product of the thickness of the etch stop layer and the relative difference in lattice constants of silicon and germanium should be such that mechanical stress or strain due to the difference in the lattice constants does not lead to the creation of fatal dislocation. In a preferred embodiment, the silicon and germanium layer has 10 atom % germanium and a thickness of 40 nanometers.

In a preferred embodiment where the first and second regions are monocrystalline silicon regions and the etch stop layer is a silicon-germanium region a solution of potassium hydroxide (KOH) is used to etch the first and second regions selectively with respect to the etch stop layer.

Generally, where the etch stop layer is intended to be at the pn junction between the first and second regions, then the etch stop layer will initially be formed between the first and second regions.

However, the position of the further or etch stop region may be adjusted so as to compensate for repositioning of the pn junction between the first and second regions due to diffusion during subsequent manufacturing steps which are carried out at a relatively high temperature.

Preferably, the first, second and further regions are formed as epitaxial layers in a conventional epitaxial semiconductor deposition apparatus such as low pressure chemical vapour deposition (LPCVD) or molecular beam epitaxy (MBE).

In an embodiment the gate comprises a gate dielectric layer which separates a conductive gate region from the wall of the trench so that the trench field effect device is an insulated gate field effect device.

The first region may be provided on a more highly doped region of the same conductivity type which forms a drain region so that the field effect device is a field effect transistor. As another possibility, the first region may be formed on a more highly doped region which may be of or may contain regions of the opposite conductivity type so as to form an insulated gate bipolar transistor (IGBT) where the gate is an insulated gate.

The present invention also provides a semiconductor device.

Various preferred features are set out in claims 2 to 12.

BRIEF DESCRIPTION OF THE DRAWING

These and other advantageous features in accordance with the invention will now be illustrated in embodiments of the present invention, now to be described with reference to the accompanying diagrammatic drawings in which.

Figure 1:
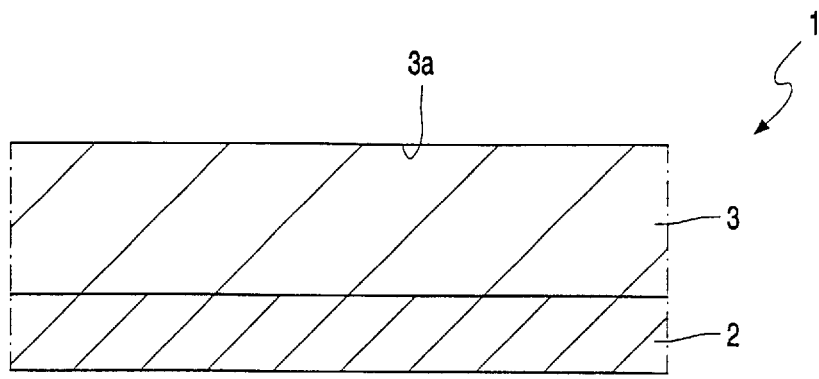
FIGS. 1 to 7 are schematic cross-sectional views through part of a semiconductor body illustrating various stages in the manufacture of a semiconductor device comprising a trench gate field effect device in accordance with the present invention.
Figure 2:
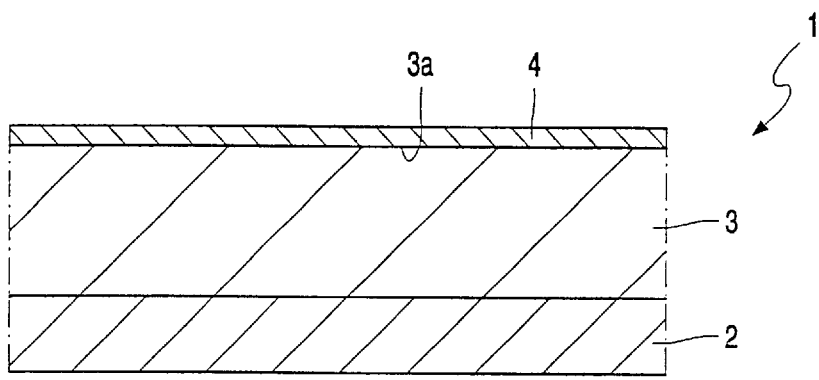

It should be noted that all the figures are diagrammatic and are not drawn to scale. Relative dimensions and proportions of parts of the drawings may have been shown exaggerated or reduced in size for the sake of clarity and convenience in the drawings. The same reference signs are generally used to refer to corresponding or similar features in different stages of manufacture.

DESCRIPTION OF THE PREFERRED EMBODIMENTS

Figure 7:
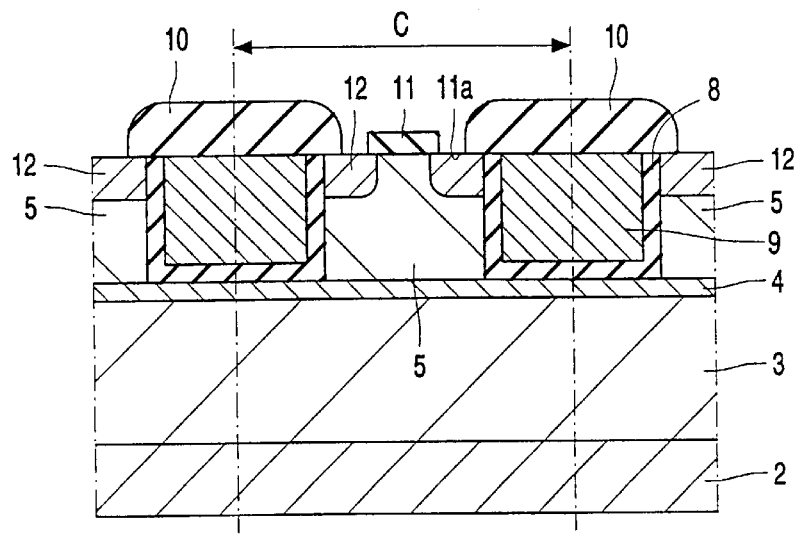
Figure 8:
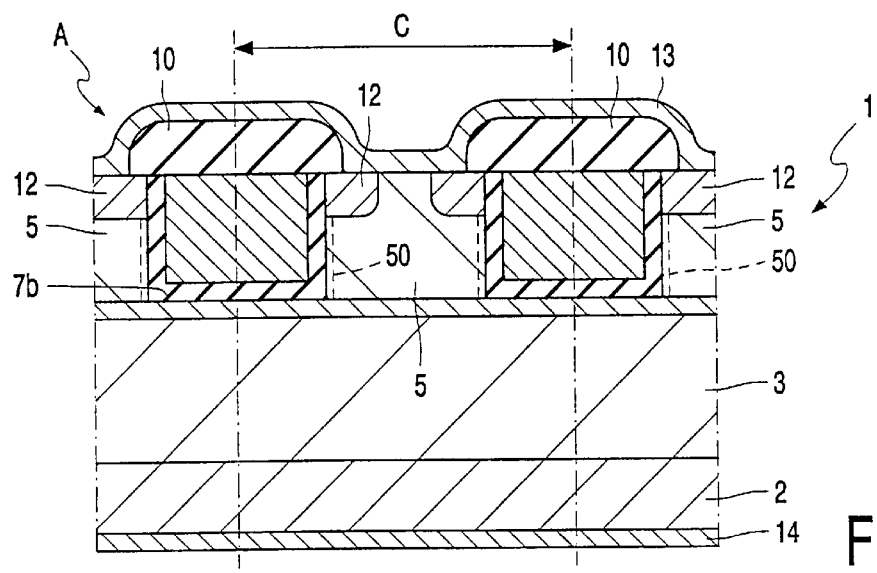
FIG. 8 is a cross-sectional view similar to FIGS. 1 to 7 showing part of a completed device.

A method embodying the invention of manufacturing a semiconductor device comprising a trench gate field effect device will now be described with reference to FIGS. 1 to 8 wherein FIG. 8 shows a schematic cross-sectional view through part of a semiconductor device manufactured using the method to be described.

As shown in FIG. 1, a semiconductor body, in this example a monocrystalline silicon semiconductor body 1, is provided. The semiconductor body comprises a highly doped substrate 2 of the one conductivity type (n conductivity type in this example) on which a first region 3 is provided as a more lowly doped epitaxial layer of the same conductivity type.

Typically, the substrate 2 is doped with arsenic or phosphorous ions to a dopant concentration of $10^{18}$ to $10^{20}$ atom/cm$^{-3}$ or similar so as to enable subsequent ohmic contact by metallisation as will be described below. Typically, the first region 3 has a dopant concentration of $1 \times 10^{14}$ atom cm$^{-3}$ to $1 \times 10^{16}$ atom cm$^{-3}$.

A further region 4 of a semiconductor which can be selectively etched relative to the first region 3 is epitaxially deposited on a free surface 3a of the first region 3 to act as an etch stop layer will be described below. In this example, the further region 4 is formed as a silicon-germanium (SiGe) semiconductor layer with the thickness and germanium content of the layer being such that mechanical stress or strain due to the differences between the lattice constants of germanium and silicon does not lead to the creation of fatal dislocations. In this example, the silicon-germanium etch stop layer 4 has a thickness of 40 nanometers (nm) and contains 10 atom % of germanium.

A second region 5 of the same semiconductor material as the first region 3 but of the opposite conductivity type (that is p conductivity type in this example) is then formed by the same epitaxial process on top of the etch stop layer 4. The layer 5 will, as described below, form the body regions of the source cells of the trench gate field effect device and will be relatively lowly doped having a dopant concentration of typically around $10^{17}$ atoms/cm$^{-3}$.

Figure 3:
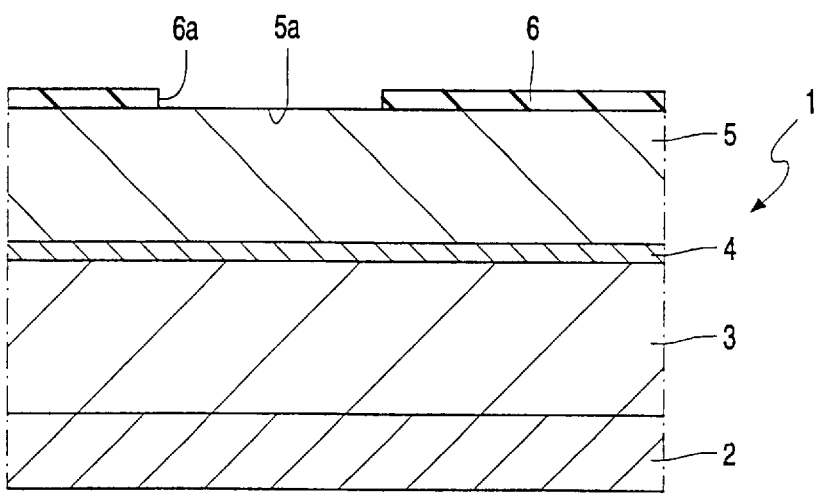

After formation of the second region or layer 5 shown in FIG. 3, a mask 6 is deposited onto the surface 5a of the second region. In this example, the mask 6 is formed of a deposited LPCVD TEOS (Tetraethylorthosilicate) or PECVD (Plasma Enhanced CVD) TEOS or a silicon nitride layer. The mask 6 is patterned using conventional photolithographic processes to define a window 6a which defines a regular mesh or grid (for example a square or hexagonal mesh or grid).

Figure 4:
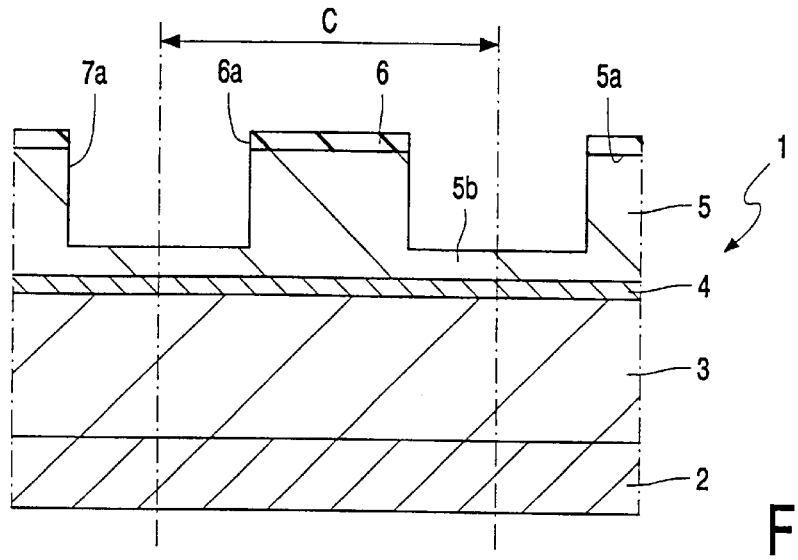

The second region or layer 5 is then etched anisotropically through the window 6a. The anisotropic etching is carried out using a plasma etching process known for etching silicon. For example, the plasma etch may be carried out using a SF$_6$/O$_2$ (sulphur hexafluoride and oxygen) gas mixture or Br$_2$ (bromine). The anisotropic etching is timed to terminate before the second region or layer 5 is completely etched through so that, as shown in FIG. 4, a part trench 7a is formed extending into the semiconductor body through the second region or layer 5 towards the etch stop layer 4 but still spaced from the etch stop layer 4 by a part 5b of the second layer or region 5. Typically, the anisotropic etching will be terminated when 90% of the depth of the trench, that is 90% of the thickness of the layer 5, has been etched through. Where the second layer or region 5 is formed of p conductivity type monocrystalline silicon having a dopant concentration of between $1 \times 10^{17}$ and $2 \times 10^{17}$ cm$^{-3}$ and the anisotropic etching process is as described above, then typically the etching of the trench portion 7a will take one minute.

Etching of the second layer or region 5 is then continued through the same mask 6 but using an isotropic etching process which etches silicon selectively with respect to the silicon-germanium etch stop layer 4. In this example, the isotropic etchant used is a concentrated potassium hydroxide solution (KOH) which etches 10% SiGe (that is silicon-germanium semiconductor material with 10% germanium) more than ten times more slowly than silicon. The isotropic etching process is timed to stop when in the SiGe etch stop layer 4.

Figure 5:
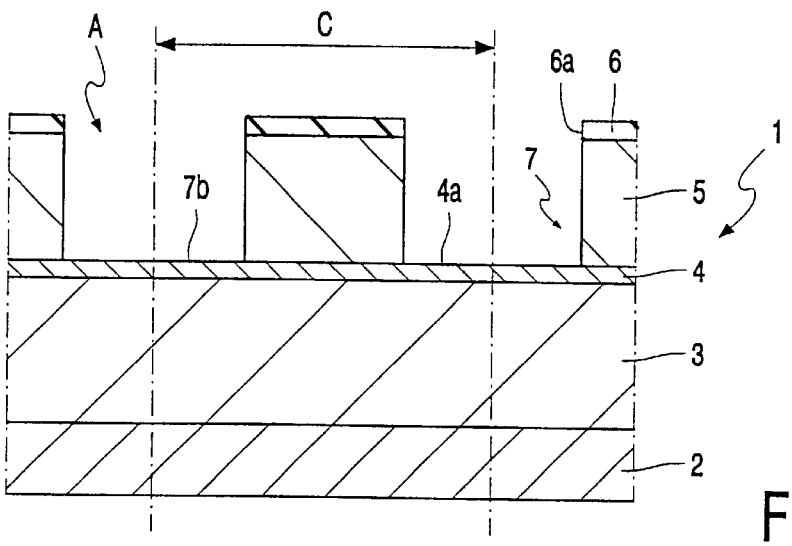

Stopping etching in the etch stop layer 4 enables any differences in trench depth after the anisotropic etching to be balanced out. As shown in FIG. 5, at the end of the selective isotropic etching process, a trench 7 having, when viewed in a direction of the arrow A in FIG. 5, the same regular mesh or grid-like structure as the window 6 is formed extending through the second region or layer 5 to the etch stop layer 4.

Figure 6:
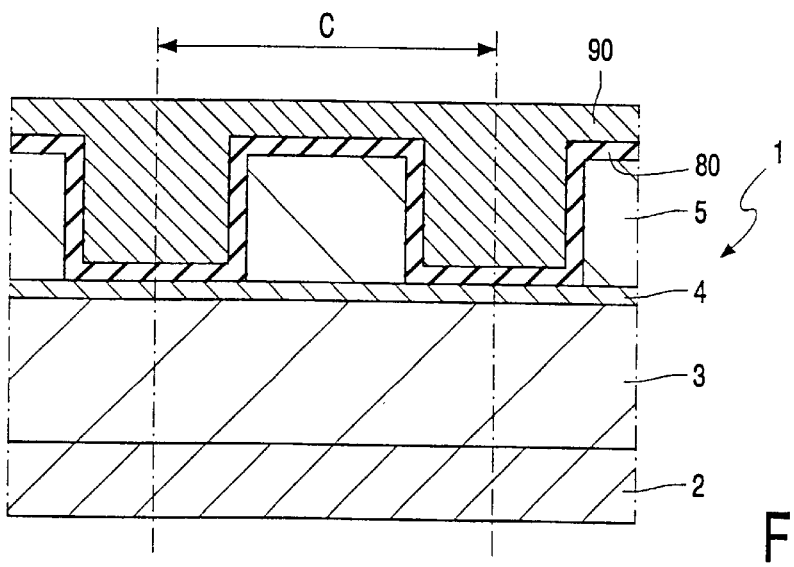

FIGS. 6 to 8 show typical further manufacturing steps which may be used to complete manufacture of the trench gate field effect device. However, any further known steps for completing manufacture of the trench insulated gate field effect device may be used. For example, the method described in U.S. Pat. No. 5,378,655 (PHB33836) after formation of the trench may be used to complete manufacture of the trench insulated gate field effect device.

As shown in FIG. 6, after formation of the trench 7, the mask 6 is removed using conventional processes and a layer 80 of silicon dioxide is thermally grown on the exposed surface of the second regional layer 5 and the etch stop layer 4a to form a gate dielectric layer. Alternatively, the gate dielectric layer may be, as is known in the art, a deposited silicon dioxide layer.

After formation of the gate dielectric layer 80, gate polycrystalline silicon is deposited in known manner to form a conductive layer 90 as shown in FIG. 6. The layers 90 and 80 are then etched back to expose the upper surface of the second region or layer 5 using conventional etching processes so as to leave within the trench 7 an insulated gate G as shown in FIG. 7. An insulating layer, generally silicon dioxide, is then deposited over the surface 5a and patterned so as to define insulating regions 10 extending over the trench gate G. A masking layer 11 is then formed using conventional photolithographic and etching techniques so as to define a window 11a through which impurities of the one conductivity type, n conductivity type in this example, are introduced by conventional implantation and/or diffusion techniques so as to form a source region 12 within each source cell adjacent the trench as shown in FIG. 7. The masking layer 11 is then removed using conventional techniques and metallisation 13 (FIG. 8) deposited on the surface 5 so as to make an ohmic contact to the source regions 12 and so as to short the source regions 12 to the body regions 5 at the surface 5a in known manner so as to inhibit parasitic bipolar action. As will be appreciated by those skilled in the art, although not shown in FIGS. 7 and 8, the insulating layer used to form the insulating regions 10 will be patterned so as to facilitate separate contact by metallisation to the insulated gate electrode G. Metallisation is also deposited on the surface 2a of the highly doped substrate 2 so as to form a drain electrode 14. As can be seen from FIG. 8, a portion or area of the second or body region 5 provides adjacent the trench 7 a conduction channel area of channel accommodating portion 50 through which conduction between the source regions 12 and the first region 3 can be controlled by a voltage applied to the gate G.

Typically the second region 5 and the trench 7 will have a depth of from 1 to 2 μm and the pitch (that is the distance between the centre of adjacent source implantation of germanium ions of the appropriate energy into the semiconductor body so as to form the etch stop layer at the desired depth within the semiconductor body.

In the above-described embodiments, the etch stop layer is formed at the pn junction between the first and second regions so that the bottom of the trench coincides with the pn junction thereby enabling the breakdown voltage of the resultant device to be optimised. The etch stop layer may, however, be located elsewhere within the semiconductor body. For example, the etch stop layer may be located within the first region so that the trench extends further into the semiconductor body than the pn junction between the first and second regions so controllably allowing the specific ON-resistance of the device to be minimised or at least reduced. Location of the etch stop layer within the first region may be achieved by growing a thin epitaxial layer of the same conductivity type as the first region after formation of the etch stop layer so that the etch stop layer is spaced away from the pn junction between the first and second regions. As another possibility, the etch stop layer may be formed by implantation of, in the above-described embodiment, germanium ions with the implantation energy being selected so as to position the etch stop layer within the first region by, after epitaxial growth of the first region 3, implanting germanium ion (possibly through an oxide layer) to form a thin implanted layer and then, after annealing of the implantation damage, epitaxially growing the second region 6.

In the embodiment described above, the etch stop layer 4 has a thickness of 40 nanometers and contains 10 atoms % of germanium. The thickness and percentage of germanium in the etch stop layer may however be varied provided that the thickness of the layer and the relative difference of the lattice constants is such that mechanical strain due to the difference in lattice constants does not lead to the creation of fatal dislocations. For example, where the silicon-germanium etch stop layer contains 5 atom % Ge then the etch stop layer may be up to about 400 nm (nanometers) thick, where the layer contains 10 atom % Ge then the layer may be up to about 60 to 65 nm thick, where the layer contains 20 atom % Ge then the layer may be up to about 20 nm to 30 nm thick and where the layer contains 30 atom % Ge the layer may be up to about 20 nm thick. cells) of the source cells will be less than 5 μm. Typically, where the device is a power device it will consist of many thousands, for example 100,000 source cells.

Figure 9:
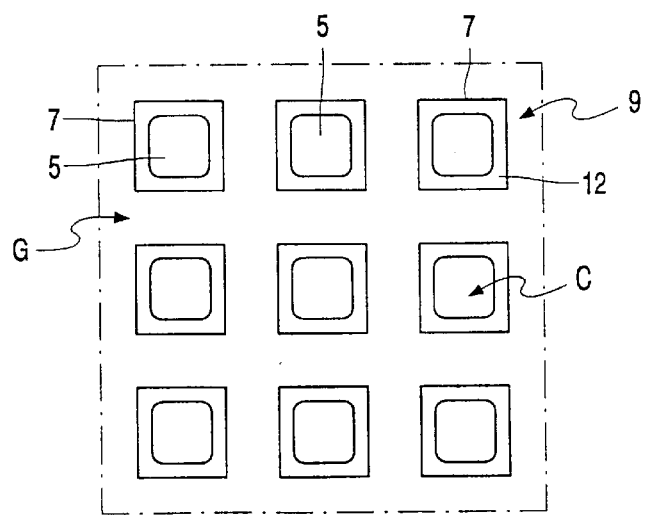
FIG. 9 is a schematic top plan view with surface insulation and metallisation removed so as to show a layout of source cells of a semiconductor device comprising a trench gate field effect device manufactured using a method embodying the present invention.

As noted above, the trench gate G defines a regular array of source cells. To illustrate this more clearly, FIG. 9 shows a top plan view taken in the direction of arrow A in FIG. 8 with the surface metallisation and insulating regions 10 omitted. In the arrangement shown in FIG. 9, the trench gate G defines a regular array of square source cells. However, other cell geometries may be used, for example the source cells may be hexagonal arranged in a hexagonal close packed array or may be in the form of stripes or rectangular cells, the actual geometry being immaterial to the present invention.

A method embodying the invention as described above enables the bottom 7b of the trench 7 to coincide with the pn junction between the first and second regions so that the corners of the trench do not extend into the first region 3. This enables the build up of large electrical fields at the corners of the trench to be alleviated without the need for a relatively highly doped central region of the opposite conductivity type which would otherwise place constraints on the minimum size of the source cells. This enables the source cells to be made smaller than would be the case if the highly doped central regions were required and thus enables the specific ON-resistance to be reduced. Also, because etching of the trench can be well controlled by the use of the selective etch process, the thickness of the layer forming the first region 3 can be optimised to reduce series resistance and the ON-resistance (RDS ON) values.

In the example described above, the etch stop layer 4 is formed on top of the first region 3 before formation of the second region 5. However, it is possible that the temperatures to which the semiconductor body is subjected during the subsequent processing may cause the pn junction between the first and second regions 3 and 5 to move due to diffusion of impurities. The location of the etch stop layer 4 may be adjusted with the help of at least one of process and device simulations and experiments so as to compensate for such movement.

In the above-described example, the etch stop layer is formed as an epitaxial layer. It may, however, be possible to form the etch stop layer 4 by These values are typical for epitaxial growth at a process temperature of between 950 and 1050 degrees Celsius. For a given percentage of germanium thicker layers may be grown at lower temperatures. For example, a 30 nm thick layer of 30 atom % Ge SiGe may be grown at a process temperature of 700 degrees Celsius. Adding carbide and oxide during growth may also enable increase in the layer thickness. Increasing the percentage of germanium in the layer has advantages in that it increases the selectivity with which the silicon can be etched with respect to the etch stop layer and also has a positive influence on the conduction path through the device when the device is conducting because of the higher mobility of germanium than silicon although increasing the percentage of germanium may slightly reduce the breakdown voltage of the device because silicon-germanium has a narrower bandgap than silicon.

As noted above, increasing the percentage of germanium in the etch stop layer means that the maximum thickness of the layer is reduced. Also, increasing the percentage of germanium in the etch stop layer has an adverse effect on the gate oxide quality where the gate oxide is a thermally grown oxide. Any detrimental effect of the germanium in the etch stop layer on the gate oxide could be overcome by providing the gate oxide as a deposited rather than a thermally grown layer. Alternatively, an extremely short anisotropic etch could be carried out after the selective isotropic etching process to remove the portion of the etch stop layer exposed by etching of the trench before formation of the gate oxide layer. Alternatively or additionally, the deposition or growth of the silicon-germanium etch stop layer may be controlled so that the percentage of germanium within the etch stop layer is decreased with continuing growth of the etch stop layer so that, for example, the percentage of germanium in the etch stop layer decreases linearly with its thickness.

In the above-described embodiment, the anisotropic etching is terminated when 90% of the depth of the trench has been etched. The relative proportions of the depth etched by the anisotropic and isotropic etching processes may, however, be adjusted. It will, of course, be appreciated that increasing the proportion of the depth of the trench etched using the isotropic process will increase the rounding of the bottom of the trench and reduce the amount of control over the lateral extent of the trench. Where such control over the lateral extent of the trench is not important, then it may be possible to use the isotopic etching process to etch the entirety of the trench.

In the above-described embodiments, a hard mask (silicon oxide or nitride) is used for both the anisotropic and isotropic etching processes. It would be possible to use a photoresist mask for the anisotropic etching process but as resist is attacked by potassium hydroxide, it would be necessary to replace this mask by a hard mask for the isotropic etching process.

The above-described embodiment uses a selective isotropic etching process that etches the silicon-germanium etch stop layer considerably more slowly than the silicon so enabling good control over the depth of the trench simply by timing the selective etching process. It may also be possible to detect the desired end point of the etching process by using an anisotropic etching process and carrying out elemental analysis of the etch material. However, the embodiment described above where the final portion of the trench is etched using a selective isotropic etching process has the advantage discussed above of enabling a slight rounding of the corners of the trench so as to reduce the high electric fields at those corners. Moreover, isotropic etching techniques are generally more homogeneous across the wafer and should result in a more uniform trench depth over the whole wafer increasing yield, process control and manufacturability.

In the above-described embodiment, the etch stop layer 4 is a silicon-germanium layer. However, other materials that allow a conduction channel to be established between the source and further regions may be used. Generally, these materials will be semiconductors although it may be possible to use a conductive material. One possibility would be to replace the silicon-germanium etch stop layer by a silicon carbide etch stop layer where the carbon constitutes a very small percentage of the silicon carbide. Another possibility would be to provide the etch stop layer as a highly doped, for example n-conductivity type, layer of silicon and either to use the fact that highly doped layers etch at different rates from lowly doped layers to determine the end point of the etch or, alternatively, to expose the etch stop layer using an anisotropic etching process and to detect the end point by carrying out elemental analysis of the etched material and stopping the etching when the dopant is identified in that elemental analysis.

In the embodiment described above, the trench field effect device is an insulated gate field effect transistor. However, the relatively highly doped substrate 2 may be formed of the opposite conductivity type to the first region 3 so as to form a so-called insulated gate bipolar transistor (IGBT) or may be formed with regions of the opposite conductivity type extending through the substrate from the metallisation 14 to the first region 3 so as to form a so-called anode-shorted insulated gate bipolar transistor.

In the embodiment described above, the source regions are semiconductor regions of one conductivity type and the body regions are of the opposite conductivity type separating the source regions from the further region which is also of the one conductivity type. Preferably, the one conductivity type is n-conductivity type so that the trench gate field effect device forms an n-channel enhancement mode device. As another possibility, however, a depletion mode device may be formed in which the body regions are of the same conductivity type as the further region.

Also, in the embodiment described above, the trench field effect device uses a doped polycrystalline silicon conductive gate. However, other known gate technologies may be used. Thus, for example, other materials may be used for the gate such as a thin metal layer which forms a silicide with polycrystalline silicon, or the gate may be made entirely of metal instead of polycrystalline silicon. Also, the gate need not necessarily be an insulated gate but may be a so-called Schottky gate in which the gate dielectric layer 8 is omitted and the conductive gate is formed of a metal that provides a Schottky barrier with the relatively lowly doped channel area or accommodating portion 50. Similarly, the source regions need not necessarily be diffused regions but may be Schottky source regions each formed by forming a Schottky barrier between a metallisation layer and the corresponding body region.

The example described above is a vertical trench field effect device with the source and drain electrodes being provided on opposed surfaces of the semiconductor body. The present invention may, however, also be applied to vertical trench field effect devices where, although the major current path is between the opposed major surfaces of the semiconductor body, the drain and source electrodes are on the same surface. The present invention may also be applied to lateral trench devices where the major current path is substantially parallel to the major surfaces.

The example described above is an n-channel device. However, it will be appreciated by those skilled in the art, that a p-channel device may be manufactured by a method embodying the invention by reversing the conductivity types of the regions discussed above so that the first and source regions are of p-conductivity type and the second or body region 5 is of n-conductivity type.

From reading the present disclosure, other variations and modifications will be apparent to a person skilled in the art. Such variations and modifications may involve equivalent and other features which are already known in the design, manufacture and use of semiconductor devices and component parts thereof and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The applicants hereby given notice that new claims may be formulated to any such features and/or combinations of such features during the prosecution of the present application or of any application derived therefrom.

What is claimed is:

1. A method of manufacturing a semiconductor device comprising a trench gate field effect device, which method comprises: providing a semiconductor body having first and second major surfaces with a first semiconductor region of one conductivity type separated from the first major surface by a second semiconductor region of the opposite conductivity type; etching a trench through the second semiconductor region; providing a gate within the trench; forming adjacent the trench a source region separated from the first region by the second region with a conduction channel area of the second region adjacent the trench providing a conduction path between the source and first regions which is controllable by the gate, characterised by providing an etch stop layer in the region of the pn junction between the first and second regions; and etching said trench using an etching process which enables the etching process to be stopped at the etch stop layer.

2. A method according to claim 1, which comprises etching said trench using an etching process which, at least as the bottom of the trench being formed by the etching process approaches, the etch stop layer etches said first and second regions selectively relative to said etch stop layer enabling etching of the trench to be stopped at said etch stop layer.

3. A method according to claim 2, which comprises etching only the portion of the trench which is closest to the etch stop layer using an etching process which etches said first and second regions selectively relative to said etch stop layer.

4. A method according to claim 2, which comprises etching the majority of the trench using an anisotropic etching process and etching the final portion of the trench to said etch stop layer using an isotropic etching process which etches said first and second regions selectively relative to said etch stop layer.

5. A method according to claim 1, which comprises providing the first and second regions as regions of monocrystalline silicon and providing said etch stop layer as a silicon-germanium layer.

6. A method according to claim 2, which comprises providing the first and second regions as regions of monocrystalline silicon and providing said etch stop layer as a silicon-germanium layer and which further comprises using potassium hydroxide to etch the first and second regions selectively with respect to said etch stop layer.

7. A method according to claim 5, which comprises providing the etch stop layer as a silicon-germanium layer selected from the following group: a silicon-germanium layer containing 10 atom % of germanium and having a thickness of 40 nanometers; a silicon-germanium layer containing 20 atom % of germanium and having a thickness of less than or equal to 20 nanometers; a silicon-germanium layer containing 5 atom % of germanium and having a thickness of less than or equal to 400 nanometers; a silicon-germanium layer containing 10 atom % of germanium and having a thickness of less than or equal to 60 to 65 nanometers; a silicon-germanium layer containing 20 atom % of germanium and having a thickness of less than or equal to 30 nanometers; and a silicon-germanium layer containing 30 atom % of germanium and having a thickness of less than or equal to 20 nanometers.

8. A method according to claim 1, which comprises providing the etch stop layer at the pn junction.

9. A method according to claim 1, which comprises providing the etch stop layer in the first region.

10. A method according to claim 1 which comprises providing the first and second regions (3 and 5) and the etch stop layer (4) as epitaxial layers.

11. A method according to claim 1, which comprises providing the gate by providing a gate dielectric layer on the walls of the trench and then providing a conductive gate region in the trench.

12. A method according to claim 1, which comprises providing the source region as a semiconductor region of the one conductivity type.

* * * * *